(12) United States Patent
Marquas

(10) Patent No.: US 9,592,735 B2
(45) Date of Patent: Mar. 14, 2017

(54) OPERATING DEVICE FOR A VEHICLE COMPONENT

(71) Applicant: Behr-Hella Thermocontrol GmbH, Stuttgart (DE)

(72) Inventor: Karsten Marquas, Arnsberg (DE)

(73) Assignee: Behr-Hella Thermocontrol GmbH, Stuttgart (DE)

( * ) Notice: Subject to any disclaimer, the term of this patent is extended or adjusted under 35 U.S.C. 154(b) by 0 days.

(21) Appl. No.: 14/443,717

(22) PCT Filed: Nov. 19, 2013

(86) PCT No.: PCT/EP2013/074155
§ 371 (c)(1),
(2) Date: May 19, 2015

(87) PCT Pub. No.: WO2014/076299
PCT Pub. Date: May 22, 2014

(65) Prior Publication Data
US 2015/0291034 A1 Oct. 15, 2015

(30) Foreign Application Priority Data
Nov. 19, 2012 (DE) .......................... 10 2012 221 107

(51) Int. Cl.
*G05G 1/00* (2006.01)
*B60K 37/06* (2006.01)
(Continued)

(52) U.S. Cl.
CPC .............. *B60K 37/06* (2013.01); *G05G 1/02* (2013.01); *H03K 17/962* (2013.01);
(Continued)

(58) Field of Classification Search
CPC ...... G05G 1/02; H03K 17/962; H03K 17/975; B60K 2350/1024; B60K 2350/30
(Continued)

(56) References Cited

U.S. PATENT DOCUMENTS 5,367,135 A * 11/1994 Selby ....................... G05G 1/02
200/341
8,755,951 B2 * 6/2014 Liu .................... G01C 21/3688
340/438
(Continued)

FOREIGN PATENT DOCUMENTS

DE  WO 2013153048 A1 * 10/2013 ......... H03K 17/9625
EP     1 988 441 A1    11/2008
WO    2013/153048 A1   10/2013

OTHER PUBLICATIONS

International Search Report for corresponding Patent Application No. PCT/EP2013/074155 dated May 12, 2014.

*Primary Examiner* — William Kelleher
*Assistant Examiner* — Zakaria Elahmadi
(74) *Attorney, Agent, or Firm* — Renner, Otto, Boisselle & Sklar, LLP

(57) ABSTRACT

The operating device (12) for a vehicle component, especially a radio, a CD and/or DVD player, a navigation device, an infotainment device, a controller for a heating or air-conditioning device, or a man-machine interface, comprises a housing (10) having a front face (14) and a longitudinally extending key body (26) that has an actuation end (24) projecting over the front face (14) of the housing (10) and a bearing end arranged inside the housing (10). The actuation end (24) has an upper side (42) and a lower side (46) that extend across the front face (14) at a non-zero angle and project therefrom, and can be actuated to input an operating command by manually exerting force onto the upper or lower side (42, 46). The operating device further comprises
(Continued)

Figure 1:
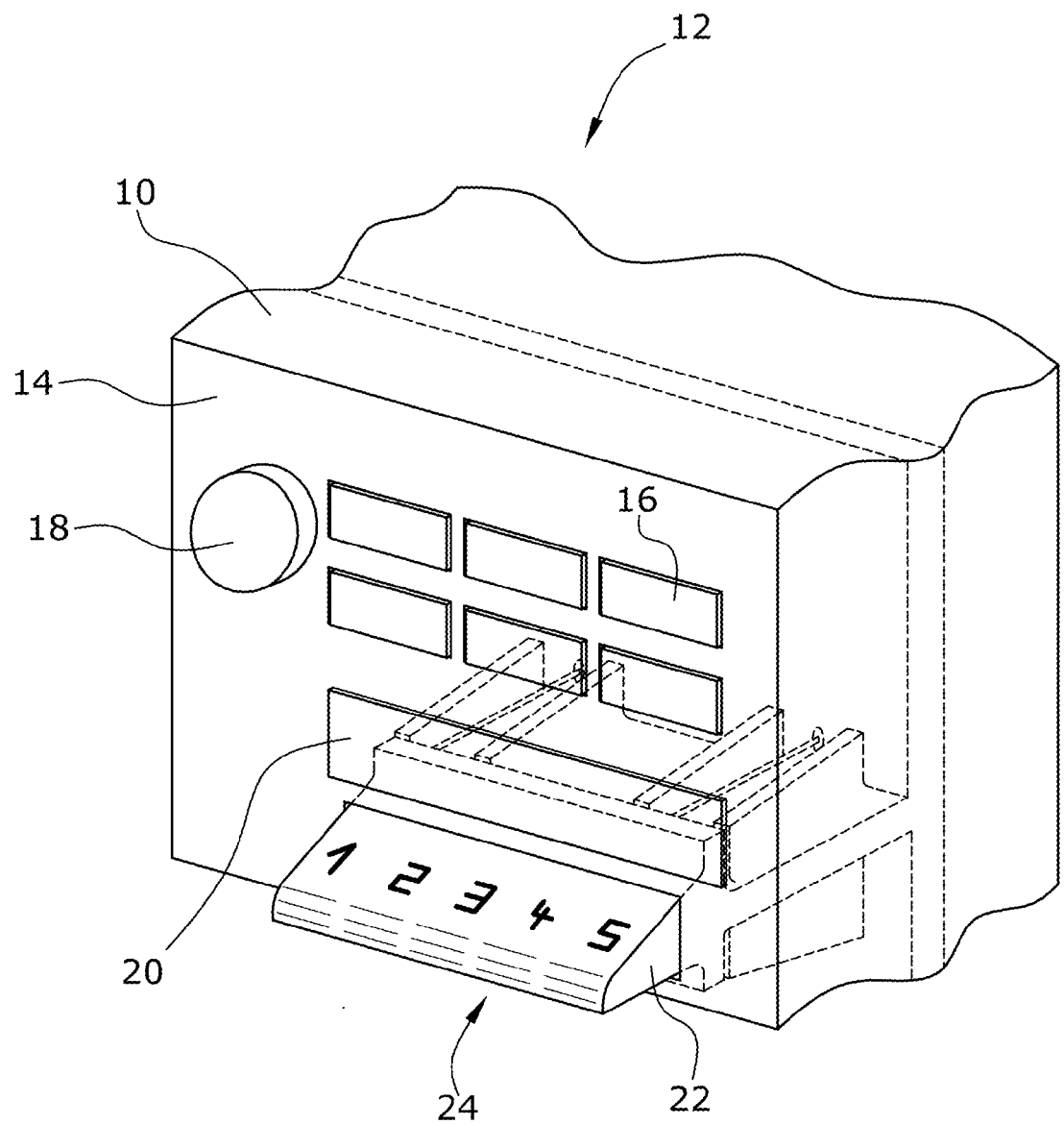

a support (28) which has a bearing end (30) by which the key body (26) can be moved in two spatial axes that are orthogonal to each other. The bearing (30) comprises at least three suspension elements (32, 34) by means of which the bearing end of the key body (26) is movably held on the support (28) and which are arranged in at least two spaced-apart suspension planes (36, 38) that extend in parallel to each other and to the length of the key body (26).

17 Claims, 5 Drawing Sheets

(51) Int. Cl.
    *G05G 1/02*     (2006.01)
    *H03K 17/96*     (2006.01)
    *H03K 17/975*     (2006.01)
    *H01G 5/16*     (2006.01)

(52) U.S. Cl.
    CPC .... *H03K 17/975* (2013.01); *B60K 2350/1024* (2013.01); *B60K 2350/30* (2013.01); *H01G 5/16* (2013.01); *H03K 2217/96062* (2013.01)

(58) Field of Classification Search
    USPC .......................................................... 74/490
    See application file for complete search history.

(56) References Cited

U.S. PATENT DOCUMENTS

| | | | |
|---|---|---|---|
| 9,195,633 B2 * | 11/2015 | Enami | B60K 37/06 |
| 2002/0070562 A1 * | 6/2002 | Lin | G05G 1/02 |
| | | | 292/163 |
| 2008/0202912 A1 * | 8/2008 | Boddie | H03K 17/962 |
| | | | 200/600 |
| 2008/0257697 A1 * | 10/2008 | Kim | D06F 39/005 |
| | | | 200/296 |
| 2014/0084990 A1 * | 3/2014 | Rossing | H03K 17/96 |
| | | | 327/517 |

* cited by examiner

OPERATING DEVICE FOR A VEHICLE COMPONENT

The invention relates to an operating device for a vehicle component which in particular is a radio, a CD and/or DVD player, a navigation device, an infotainment device, a heating or air conditioning control device or, generally speaking, a man-machine interface.

Operating devices for, in particular, vehicle components typically comprise a front bezel or a front face at which a plurality of operating elements, possibly also of different designs, are arranged in the form of, for example, rotary knobs, pushbuttons, rocker switches or the like. In addition, operating elements exist in the form of key bodies protruding from the front face, which comprise an actuation end having an upper side and a lower side. Such operating elements are sometimes also referred to as balcony keys, since their actuation ends protrude beyond the front face of the operating device.

If embodied as an actuation bar, such a key body may comprise a plurality of symbol fields (for example, a plurality of adjacent regions bearing consecutive numbers), with the entire key body moving regardless of the region in which it is actuated. By means of a capacitive proximity sensor system it is possible to detect which symbol field is touched with a finger of a hand when the key body is actuated.

Further, it has been found that it may be advantageous in terms of operating comfort if the key body can be moved only to a substantially unnoticeable degree when actuated. An acoustic or tactile feedback may provide an operator with an acknowledgment of the actuation of the key body.

From EP 1 988 441 A1 an operating device for a vehicle component is known, wherein the operating device is provided with a housing having a front face and a key body having a length, the key body having an actuation end protruding beyond the front face of the housing and a bearing end arranged inside the housing. The actuation end has an upper side and a lower side which protrude beyond the front face at an angle other than zero degrees and which are actuable for inputting an operating command by manual exertion of force on the upper or lower side.

It is an object of the invention to provide an operating device having a key body protruding beyond the front face of the housing of the operating device, which key body, when actuated, performs a precise, reproducible and in particular uniform movement.

To achieve this object, the invention provides an operating device for a vehicle component which in particular is a radio, a CD and/or DVD player, a navigation device, an infotainment device, a heating or air conditioning control device or, generally speaking, a man-machine interface, wherein the operating device is provided with
- a housing having a front face,
- a key body having a length, which comprises an actuation end protruding beyond the front face of the housing and a bearing end arranged inside the housing,
- wherein the actuation end has an upper side and a lower side, which extend beyond the front face under an angle different from zero degrees and which are actuable for inputting an operating command by manual exertion of force on the upper or lower side,
- a supporting body having a bearing by which the key body can be moved along two spatial axes that are substantially orthogonal with respect to each other,
- wherein the bearing comprises at least three suspension elements by means of which the bearing end of the key body is movably mounted at the supporting body and which are arranged in at least two mutually spaced suspension planes that are parallel to each other and to the longitudinal dimension of the key body.

The key body of the present invention, which has an elongated actuation bar similar to a spacebar key of a computer keyboard, protrudes beyond the front face of the housing. A supporting body is situated in the housing, having a bearing for a (slightly movable) mounting of the key body along two spatial directions or axes that are substantially orthogonal with respect to each other. The actuation end of the key body protrudes beyond the front face of the housing. The actuation end (i.e. the actuation bar) has an upper and a lower side that protrude beyond the front face under an angle different from zero degrees. By manual exertion of force on the upper or lower side, the key body performs a slight downward or upward movement.

The particularity of the operating device of the present invention lies in the configuration of the bearing which comprises at least three suspension elements. These three suspension elements are distributed to two suspension planes which extend substantially at an angle to the front face and are substantially parallel to each other and are also substantially parallel to the longitudinal dimension of the key body.

Owing to the suspension elements, which are rigid, resilient elements in the form of rods or the like, for example, an actuation of the key body causes a slight parallel displacement of the same relative to the front face of the housing. In this regard, it is decisive that the present kind of arrangement and design of the suspension elements cause a play-free bearing of the key body at the supporting body. Moreover, the bearing of the key body is a low-noise bearing.

The concept of the present invention advantageously allows the realization of a tactile feedback regarding the operation of the actuation bar or the actuation end of the key body, the feedback being provided via an actuator which generates vibrations and causing the key body to vibrate in a direction orthogonal to the actuation thereof. This is due to the fact that, by means of suspension elements clamped at the supporting body as well as at the key body, the bearing of the present invention allows for a parallel displacement of the key body relative to the front face of the operating device or to the support body.

In a further advantageous embodiment of the invention it is provided that the bearing comprises a projection element protruding from the supporting body, which protrudes from the supporting body in substantially the same spatial direction as the suspension elements and is arranged between the two suspension elements, and that the key body may possibly rest on the projection element of the bearing.

It is suitable to provide four suspension elements that serve to support the key body at the supporting body. In this case, two suspension elements are respectively arranged in a common suspension plane. It is suitable if two suspension elements are fastened, respectively, at the two opposite end portions of the actuation bar or the key body, which elements are arranged in the two different suspension planes.

It is also conceivable to arrange two suspension elements in one suspension plane and to arrange only one suspension element in the other suspension plane. It is also possible to arrange more than two suspension elements in each of the suspension planes.

Owing to the fixed clamping of the suspension elements both at the supporting body and the actuation bar, the above mentioned parallel offset of the actuation bar is obtained when it is actuated.

Spring steel rods are particularly suited as suspension elements, i.e., stated in a more general manner, pressure and tension resistant and rigid, in particular resilient suspension elements. These suspension elements are, for example, bar-shaped elements (round or angular bars). In this context, the suspension elements bend along their entire length between the supporting body and the key body along the two spatial axes that are substantially orthogonal to each other.

However, concepts for the suspension elements are conceivable as well, wherein two separate sections of a suspension element are responsible for the flexibility in the other of the two spatial axes, respectively. In this case, each suspension element may comprise a resilient planar strip material, in particular a spring steel band, which is twisted by 90° about its longitudinal axis. As an alternative, each of the sections may be formed as a resilient planar strip material, in particular a spring steel band, bent into a U-shape, and the two U-shaped strip material sections may be turned by 90° with respect to their two pairs of legs and may be directed in opposite directions, seen from their base sections.

In a further advantageous embodiment of the invention it may be provided that a movement sensor is provided for the detection of a parallel displacement of the key body when manual force is exerted on the upper or the lower side of the actuation bar. This movement sensor detects an operation of the actuation bar and is configured as a pressure or force sensor, for example. In addition, the operating device suitably includes an evaluation unit for converting an operation command when the key body is actuated. This evaluation unit may then, for example, also drive the actuator already mentioned above, when an operation of the actuation bar of the key body is detected by the movement sensor.

In a further advantageous embodiment of the invention, the operating unit may be provided with a capacitive sensor for detecting a relative movement of the key body and the supporting body, which capacitive sensor is provided with
- a first electrode, which has a first electrically conductive electrode surface and which is arranged on a first electrode supporting body,
- a second electrode, which is opposite the first electrode, has a second electrically conductive electrode surface and is arranged on a second electrode supporting body, wherein the second electrode supporting body is designed as a resilient film element that is supported on the first electrode supporting body on two spaced-apart opposing support sections on both sides of the two electrodes, and
- a pressure body on the side of the electrode supporting body facing away from the second electrode,
- wherein said pressure body comprises at least two pressure projections that rest, in the region between the support sections of the second electrode supporting body, against the side of the second electrode supporting body facing away from the second electrode and that press against the second electrode supporting body while bending it, when there is a relative movement between the first electrode supporting body and the second pressure body,
- wherein the at least two pressure projections are spaced apart from each other in the same spatial direction in which the support sections of the second electrode supporting body are spaced apart, and
- wherein the second electrode is secured to the second electrode supporting body only in a securing section that is substantially in the center between the pressure regions of the second electrode supporting body in which the pressure projections rest against the second electrode supporting body so that the movement stroke between the pressure body and the second electrode supporting body can be converted into a movement stroke between the two electrodes that is larger than the former movement stroke.

The capacitive sensor is of such a structure that a mechanical conversion of the movement of both bodies into a closer approximation or a greater degree of change in the distance between the two electrodes so that it is still possible to reliably detect small strokes when the amplification ratios are small. This is due to the configuration of in particular the second electrode supporting body as a resilient film element to which the second electrode is secured merely in a single (central) section. The second electrode supporting body is supported on the first electrode supporting body at two opposite support sections, the first electrode supporting body itself supporting the first electrode. These two support sections are situated outside of both electrodes. Between these support sections and on both sides of the securing section of the second electrode on the second electrode supporting body, a pressure body presses against this second electrode supporting body, which pressure body is provided with two pressing projections for this purpose. Due to the resilient second electrode supporting body being bent when the pressure projections press against the second electrode supporting body, the second electrode is advanced towards the first electrode to an extent greater than the movement of the first electrode supporting body relative to the pressure body. Thereby, a mechanical conversion as described above is realized.

In an advantageous development of the capacitive sensor it may be provided that the arrangement of the support sections of the second electrode supporting body on the first electrode supporting body and of the pressure projections of the pressure body is symmetrical with respect to the securing section of the second electrode supporting body for the second electrode.

Further, it may be advantageous if the first electrode supporting body has a recess on at least two opposite sides which is defined delimiting edge sections, in which recess the first electrode is arranged, with the second electrode supporting body being supported on the delimiting edge sections by its support sections.

In a further advantageous embodiment of the capacitive sensor it is provided that the first electrode supporting body has another first electrode on its side averted from the first electrode, and that another second electrode supporting body having another second electrode as well as further support sections and another pressure body having further pressure projections are provided, their arrangement being as defined in one of the preceding claims.

Finally, it should be noted that spring steel is particularly suited as the film element.

Figure 2:
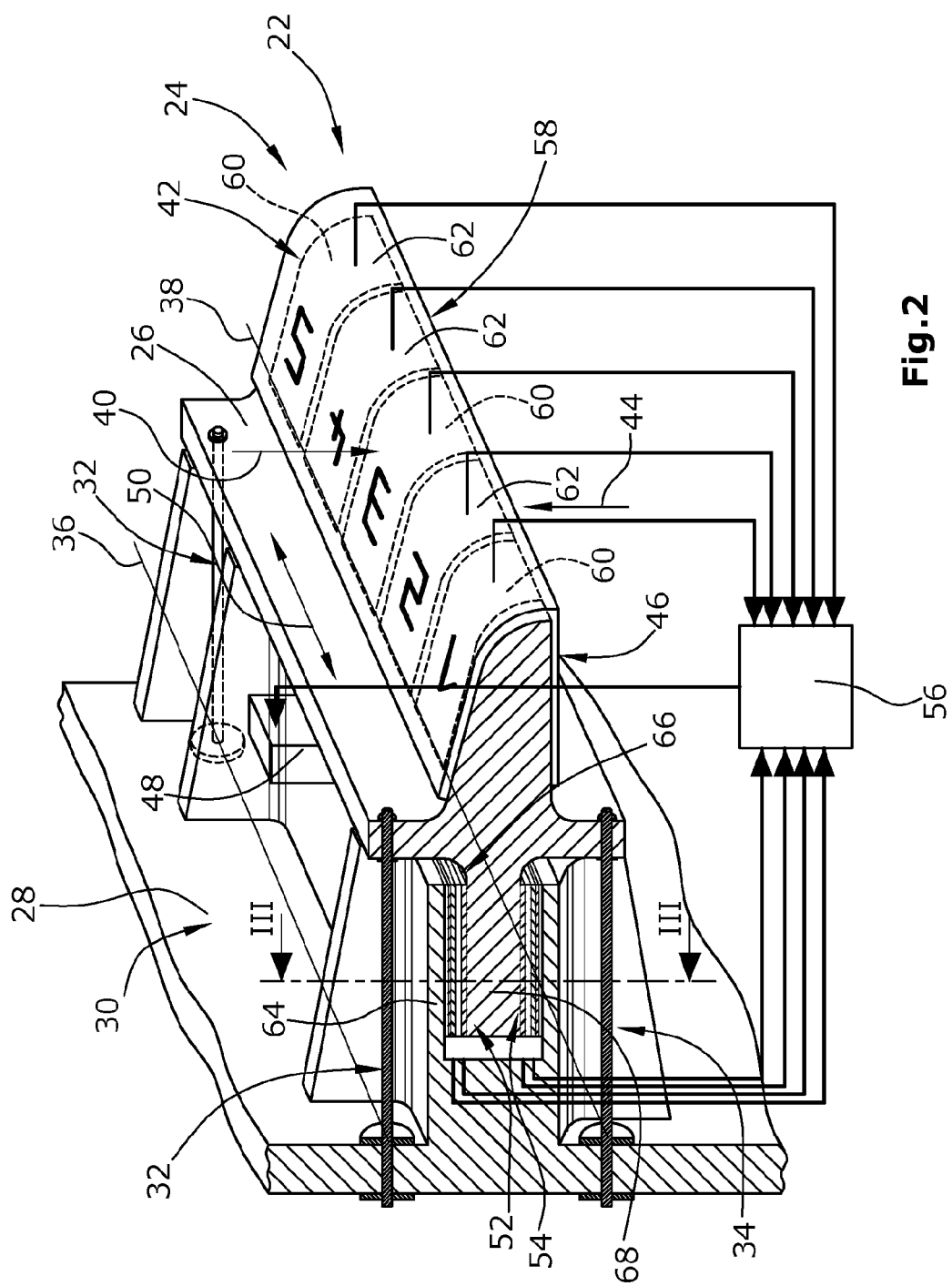
Figure 3:
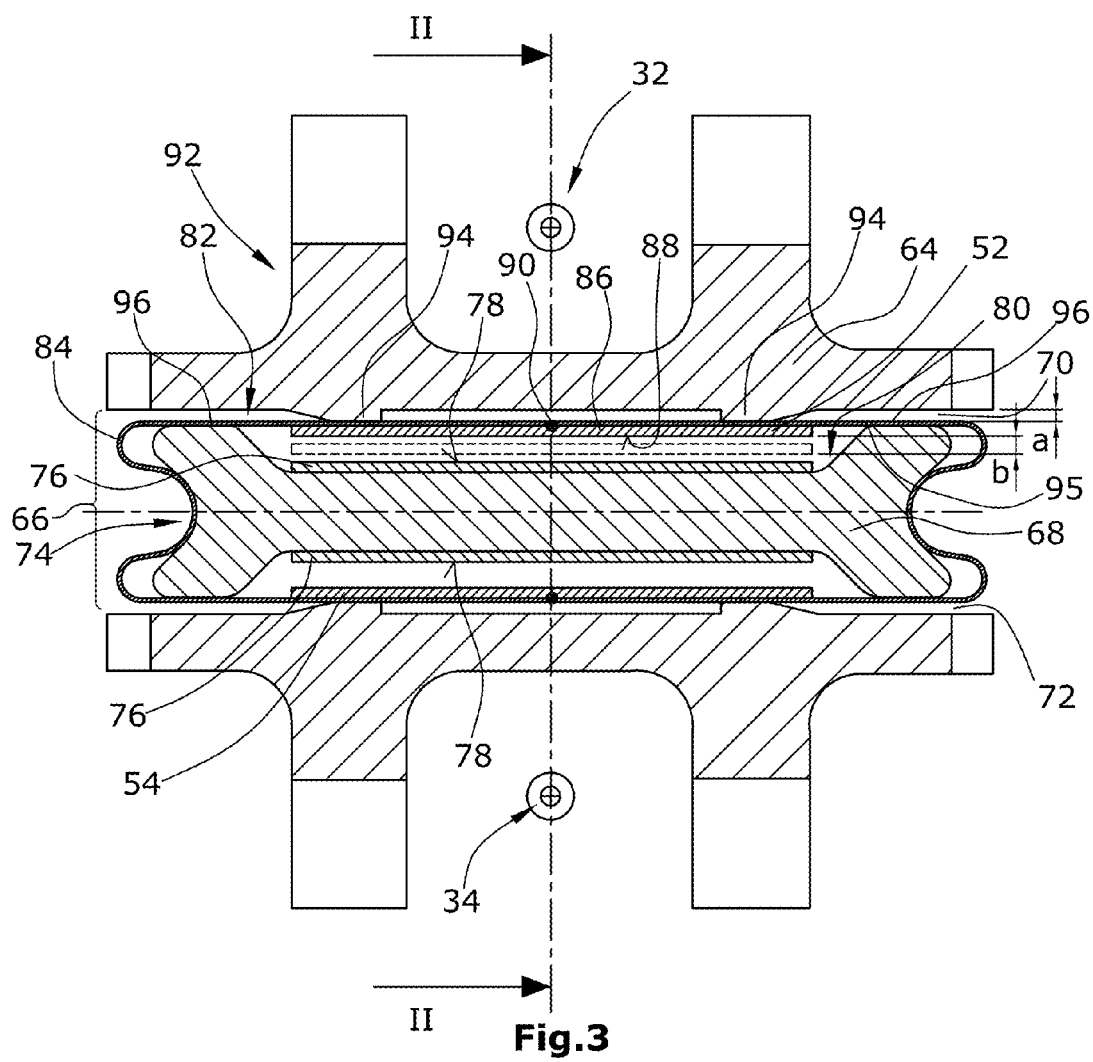
Figure 4:
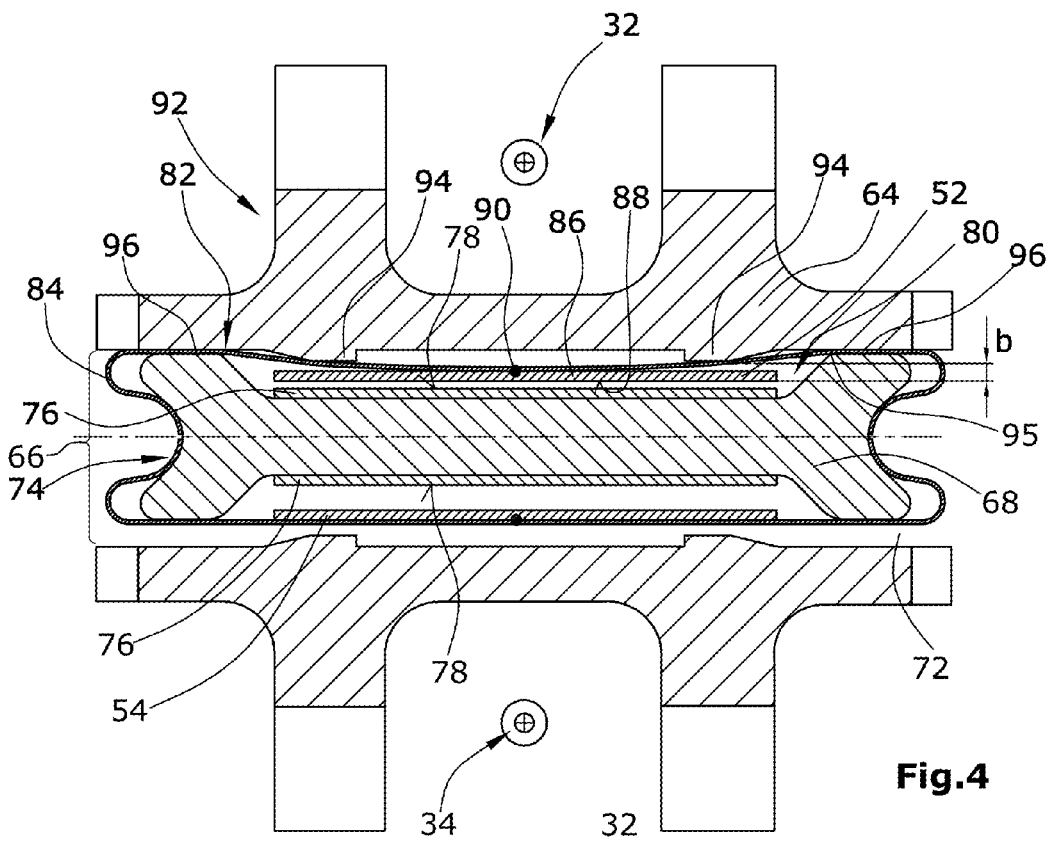
Figure 5:
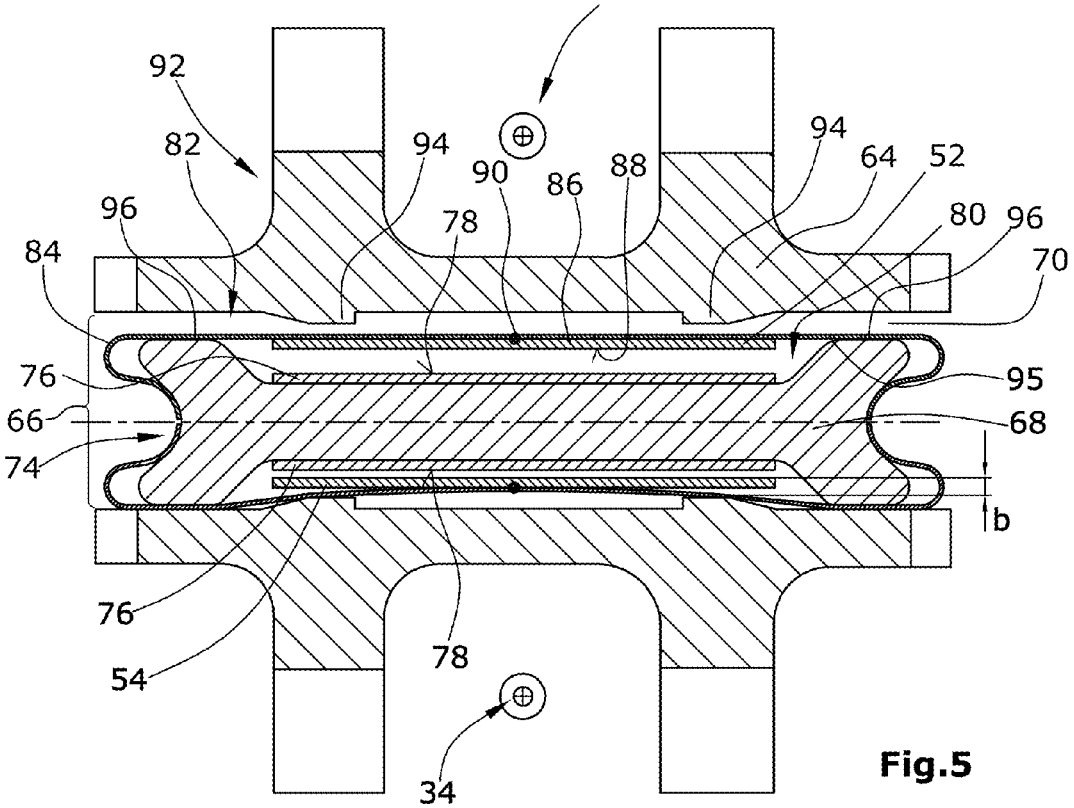
Figure 6:
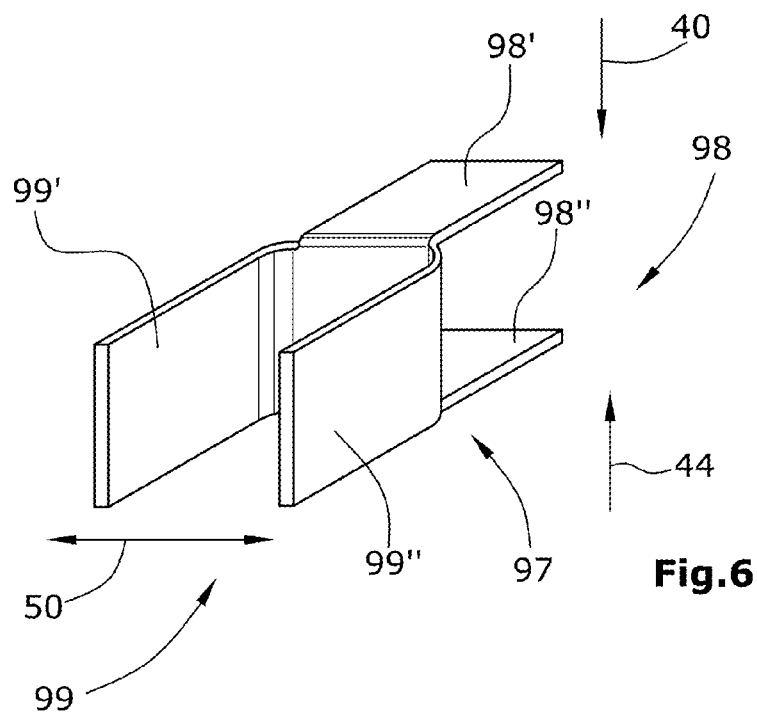
Figure 7:
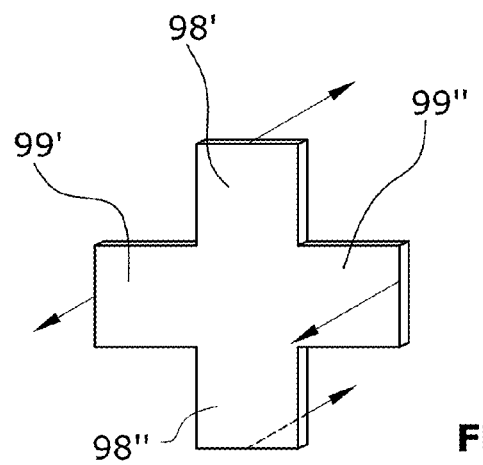
Figure 8:
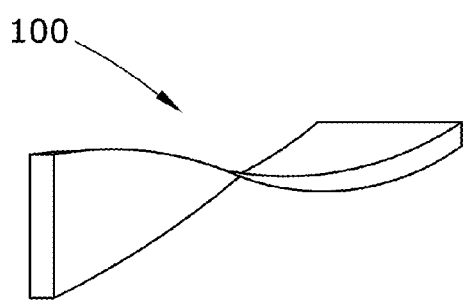

The invention will be described in more detail hereinafter with reference to an embodiment and to the drawings. The Figures specifically show:

FIG. 1 a perspective view illustrating a part of an exemplary operating device,

FIG. 2 a perspective sectional view illustrating the bearing for a play-free and low-noise mounting of the key body at the supporting body (taken along the sectional line II-II in FIG. 3), FIG. 3 a section through the bearing with a pressure or force sensor integrated therein as a movement sensor for the detection of an operation of a key body or an actuation bar, and FIGS. 4 and 5 the movement of the key body relative to the supporting body when pressure is exerted on the upper or the lower side of the actuation bar of the key body, FIGS. 5 to 7 a second embodiment of the design of the suspension elements, and FIG. 8 a further embodiment of a suspension element.

FIG. 1 is a perspective view of a housing 10 of an operating device 12. The housing 10 has a front face 14 with pushbuttons 16, a rotary knob 18, a display unit 20 and an actuation bar 22. The actuation bar 22 forms the actuation end 24 of a key body 26 (see FIG. 2) supported at a supporting body 28 which itself is arranged inside the housing 10.

A bearing 30 serves to support the key body 26, which bearing has four suspension elements 32, 34 in this embodiment (in FIG. 2, one of the two bearing elements 34 is not visible) that are distributed onto two mutually parallel suspension planes 36, 38. The suspension elements 32, 34 are arranged in pairs at the ends of the key body 26 arranged in the longitudinal direction of the actuation bar 22. They are held clamped both at the supporting body 28 and at the key body 26 so that when force is exerted on the upper side 42 of the actuation bar 22 in the direction of the arrow 40, as well as when force is exerted on the lower side of the actuation bar 22 in the direction of the arrow 44, a parallel displacement of the actuation bar 22 relative to the supporting body 28 is caused. When the actuation bar 22 is operated, this parallel displacement is highly precise, play-free, low-noise and minimal.

As indicated in FIG. 2, a vibratory actuator 48 acts between the supporting body 28 and the key body 26 or on the key body 26, causing the key body 26 to vibrate in the direction of the double arrow 50 when the actuation bar 22 of the key body 26 is operated. As an alternative to an oscillating vibratory actuator 48 another mechanism may be used that operates electro- or magneto-mechanically, for example, and comprises, for instance, a U-shaped magnetic yoke with a coil for a pulse-like excitation/generation of a magnetic field to attract/repulse a magnetic armature and moves the key body 26 in one transversal direction, with the key body 26 automatically returning (when the coil is de-energized) due to the mechanical restoring tension in the suspension elements 34 generated as they are deformed by the transversal movement. The yoke and the magnetic armature are mounted on the supporting body 28 or the key body 26 so that the body connected with the magnetic armature moves back and forth with respect to the other body (or vice versa).

The operation of the actuation bar 22 is detected by pressure sensors, force sensors or path sensors 52, 54 described in more detail hereunder and functioning capacitively in the present embodiment, the sensors being electrically connected with an evaluation unit 56 which, among others, also drives the vibratory actuator 48. In addition, the key body 26 includes a proximity sensor system 58 in the form of capacitively acting electrodes 60 that are assigned to different symbol fields 62 of the actuation bar 22. Thus, the two sensors 52, 54 (where only one sensor would be sufficient) make it possible to detect whether the actuation bar 22 has been operated or not. Further, the capacitive proximity sensor system 58 detects which of the symbol fields 62 the finger of a hand contacts when the actuation bar 22 is operated. The detection of the operation of the actuation bar 22 is then acknowledged by controlling the vibratory actuator 48 or a similar movement mechanism (see above), thereby causing a tactile feedback that is detected by the user.

As can be seen with reference to FIG. 2, for example, a projection element 64 extends from the supporting body 28, which has a receiving space 66 open to the key body 26. A protrusion 68 protrudes into this receiving space 66 as a bearing end of the key body 26. Between the protrusion 68 and the projection element 64, two gaps 70, 72 (see FIG. 3) are provided between which a respective one of the sensors 52, 54 is arranged. When the actuation bar 22 is operated, the protrusion 68 is displaced upward or downward within the receiving space 66 while maintaining its orientation (due to the above mentioned parallel displacement of the key body 26), which is detected by the two sensors 52, 54 (or one of the two sensors).

An exemplary structure of the sensor system can be seen in FIG. 3. The protrusion 68 forms a first electrode supporting body 74 supporting a first electrode 76 with an electrode surface 78. This electrode 76 is arranged within a recess 80 of the first electrode supporting body 74. The recess 80 is spanned by a second electrode supporting body 82 which, in the present embodiment, is designed as a spring steel film element 84. At the second electrode supporting body 82, a second electrode 86 is provided, having a second electrode surface 88 facing the electrode surface 78 of the first electrode 76. The second electrode 86 is connected with the resiliently flexible, bendable spring steel film element 84 exclusively in its central portion, as is shown at the securing point 90 in FIG. 3.

The projection element 64 rests on the second electrode supporting body 82 as a pressure body 92, the element resting on the inner side of the body delimiting the receiving space 66. For this purpose, the pressure body 92 has two pressure projections 94 that are arranged substantially symmetrically to the securing point 90 of the second electrode 86 on the second electrode supporting body 82. Both pressure projections 94 rest in that region of the second supporting body 82, in which the spring steel film element 84 of the second supporting body 82 spans the recess 80 in the first supporting body 74. It should further be mentioned that the spring steel film element 84 is supported on the first supporting body 74 at the opposite delimiting edge sections 95 of the recess 80 thereof; thus, these delimiting edge sections 95 of the recess 80 form the bearings for the support sections 96 of the second electrode supporting body 82.

Owing to the above described structure which is also formed on the—with reference to FIG. 3—lower side of the first supporting body 74 in cooperation with the—also with reference to FIG. 3—lower part of the pressure body 92 (where it forms the second sensor 54), it is achieved that a relatively small stroke movement of the first supporting body 74 or of the protrusion 68, which occurs in the receiving space 66, is converted into a displacement of the two electrodes 76, 86 that is larger than the stroke. This becomes clear when comparing FIG. 3 with each of the FIGS. 4 and 5 that illustrate the movement of the first electrode supporting body 74 relative to the pressure body 92, depending on whether an actuation force is exerted on the lower side 46 (FIG. 4) or the upper side (FIG. 5) of the actuation bar 22. The displacement b of the second electrode 86 (see FIGS. 4 and 5 and indicated in FIG. 3) is larger than the distance a (FIG. 3) the key body 26 travels when it is actuated.

Owing to the mechanical structure illustrated in FIGS. 3 to 5, a kind of transmission is provided for converting the stroke of the first electrode supporting body 74 relative to the pressure body 92 into a closer approximation of the two electrodes 76, 86 compared to the stroke.

FIGS. 6 and 7 illustrate an alternative design of a suspension element 97 having two sections 98, 99 of spring steel band or punched planar spring steel material, the sections being bent in U-shape and being fastened to the supporting body 28 by the section 98 and to the key body 26 by the section 99. The section 98 is adapted to be moved up and down in the direction of the arrows 40 and 44 (see FIG. 1), whereas the section 99 is adapted to be moved laterally in the direction of the double arrow 50. FIG. 7 illustrates how the two sections 98, 99 are made, starting from a cross-shaped planar spring steel material by bending the legs 98', 98" by 90° (forming of section 98—indicated in FIG. 7 by the arrows starting from the legs 98', 98") and by bending the legs 99', 99" by 90° (forming of section 99—indicated in FIG. 7 by the arrows starting from the legs 99', 99"). A single spring steel band that is twisted by 90° about the longitudinal axis over its length or in a manner centered in a (central) longitudinal section may as well be used as a suspension element 97 (see the embodiment of such a suspension element 100 illustrated in FIG. 8).

LIST OF REFERENCE NUMERALS 10 housing of the operating device
12 operating device
14 front face of the housing
16 pushbuttons
18 rotary knob
20 display unit
22 actuation bar of the key body
24 actuation end of the key body
26 key body
28 supporting body
30 bearing of key body
32 suspension elements of the bearing
34 suspension elements of the bearing
36 suspension plane
38 suspension plane
40 arrow
42 upper side of the actuation bar
44 arrow
46 lower side of the actuation bar
48 vibratory actuator
50 double arrow
52 path sensor
54 path sensor
56 evaluation unit
58 proximity sensor system
60 electrodes of the proximity sensor system
62 symbol fields on the actuation bar
64 projection element
66 receiving space for the projection element
68 protrusion
70 gap
72 gap
74 first electrode supporting body
76 first electrode
78 electrode surface of the first electrode
80 recess
82 second electrode supporting body
84 spring steel film element
86 second electrode
88 electrode surface of the second electrode
90 securing point
92 pressure body
94 pressure projections on the pressure body
95 delimiting edge section of the recess
96 support sections of the second electrode supporting body
98 first section of the suspension element
98' leg of this first section
98" leg of this first section
99 second section of the suspension element
99' leg of this second section
99" leg of this second section
100 suspension element

The invention claimed is:

1. An operating device for a vehicle component, in particular a radio, a CD and/or DVD player, a navigation device, an infotainment device, a controller for a heating or air-conditioning device, or a man-machine interface, comprising
a housing having a front face,
a key body having a length, which comprises an actuation end protruding beyond the front face of the housing and a bearing end arranged inside the housing,
wherein the actuation end has an upper side and a lower side, which extend beyond the front face at an angle different from zero degrees and which is actuable for inputting an operating command by manual exertion of force on the upper or lower side,
a supporting body having a bearing by which the key body can be moved along two spatial axes that are substantially orthogonal with respect to each other,
wherein the bearing comprises at least three suspension elements by means of which the bearing end of the key body is movably mounted at the supporting body and which are arranged in at least two mutually spaced suspension planes that are parallel to each other and to the longitudinal dimension of the key body; and
wherein the bearing comprises a projecting element protruding from the supporting body, which protrudes from the supporting body in substantially the same spatial direction as the suspension elements and is arranged between the two suspension elements, and that the key body may rest on the projection element of the bearing when operated.

2. The operating device of claim 1, wherein two suspension elements are respectively arranged in a common suspension plane, and that the other suspension elements extend in at least one other additional suspension plane.

3. The operating device of claim 1, wherein three suspension elements are provided.

4. The operating device of claim 1, wherein four suspension elements are provided which are distributed onto two suspension planes, wherein two suspension elements respectively extend in a common suspension plane.

5. The operating device of claim 1, wherein the suspension elements are pressure and tension resistant and rigid and/or that the suspension elements are designed as spring steel bars.

6. The operating device of claim 1, wherein the suspension elements are bendable along their entire length between the supporting body and the key body along the two spatial axes that are substantially orthogonal to each other.

7. The operating device of claim 1, comprising at least one movement sensor for the detection of a parallel displacement of the key body when manual force is exerted on the upper or the lower side of the actuation bar.

8. The operating device of claim 7, wherein the at least one movement sensor is configured as a pressure or force sensor arranged between and in operative connection with both the supporting body and the bearing end of the key body.

9. The operating device of claim 1, comprising an evaluation unit for converting an operation command when the actuation end of the key body is actuated and/or an actuator for moving the key body in a direction orthogonal to the movement of the key body when the actuation end thereof is actuated.

10. The operating device of claim 1, wherein the key body is moved in an oscillating manner.

11. The operating device of claim 1, wherein the suspension elements are bendable along one spatial axis in a first section and along the other spatial axis in a second section.

12. The operating device of claim 11, wherein the suspension elements each comprise a resilient, planar strip material, which is twisted by 90° about its longitudinal axis.

13. The operating device of claim 12, wherein the resilient, planar strip material is a spring steel band.

14. The operating device of claim 11, wherein each of the sections is formed as a resilient planar strip material bent into a U-shape that forms two U-shaped strip material sections that are turned by 90° with respect to respective pairs of legs and in opposite directions, seen from base sections of the U-shaped strip material sections.

15. The operating device of claim 11, wherein the resilient, planar strip material is a spring steel band.

16. An operating device for a vehicle component, in particular a radio, a CD and/or DVD player, a navigation device, an infotainment device, a controller for a heating or air-conditioning device, or a man-machine interface, comprising
   a housing having a front face,
   a key body having a length, which comprises an actuation end protruding beyond the front face of the housing and a bearing end arranged inside the housing,
   wherein the actuation end has an upper side and a lower side, which extend beyond the front face at an angle different from zero degrees and which is actuable for inputting an operating command by manual exertion of force on the upper or lower side,
   a supporting body having a bearing by which the key body can be moved along two spatial axes that are substantially orthogonal with respect to each other,
   wherein the bearing comprises at least three suspension elements by means of which the bearing end of the key body is movably mounted at the supporting body and which are arranged in at least two mutually spaced suspension planes that are parallel to each other and to the longitudinal dimension of the key body; and
   further comprising at least one movement sensor for the detection of a parallel displacement of the key body when manual force is exerted on the upper or the lower side of the actuation bar.

17. An operating device for a vehicle component, in particular a radio, a CD and/or DVD player, a navigation device, an infotainment device, a controller for a heating or air-conditioning device, or a man-machine interface, comprising
   a housing having a front face,
   a key body having a length, which comprises an actuation end protruding beyond the front face of the housing and a bearing end arranged inside the housing,
   wherein the actuation end has an upper side and a lower side, which extend beyond the front face at an angle different from zero degrees and which is actuable for inputting an operating command by manual exertion of force on the upper or lower side,
   a supporting body having a bearing by which the key body can be moved along two spatial axes that are substantially orthogonal with respect to each other,
   wherein the bearing comprises at least three suspension elements by means of which the bearing end of the key body is movably mounted at the supporting body and which are arranged in at least two mutually spaced suspension planes that are parallel to each other and to the longitudinal dimension of the key body; and
   further comprising an evaluation unit for converting an operation command when the actuation end of the key body is actuated and/or an actuator for moving the key body in a direction orthogonal to the movement of the key body when the actuation end thereof is actuated.

\* \* \* \* \*